Figure 6:
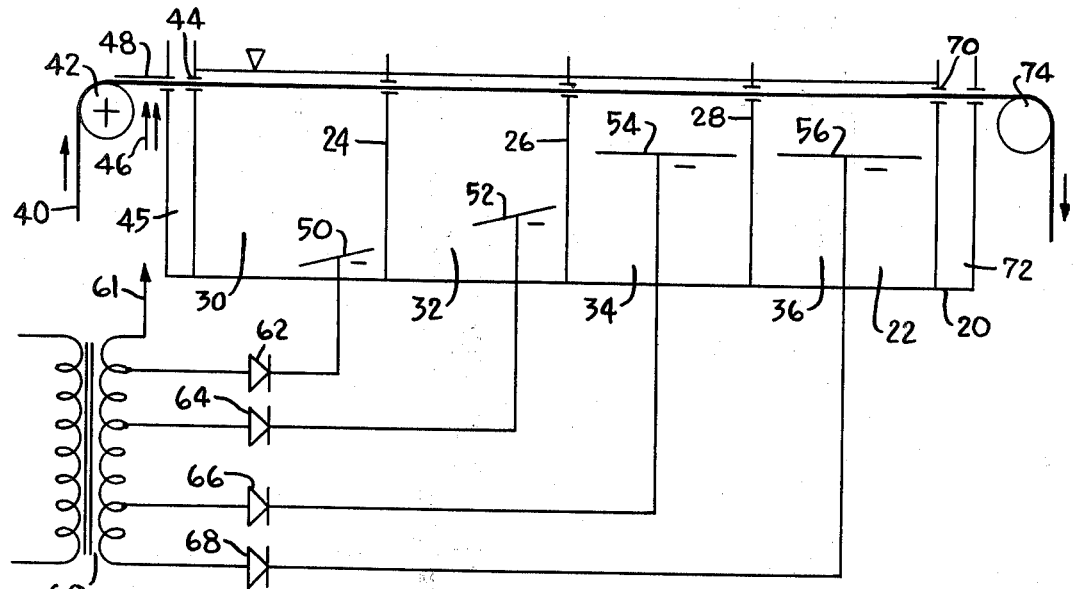

United States Patent [19]

Severus-Laubenfeld

[11] 4,177,127

[45] Dec. 4, 1979

[54] DEVICE FOR THE PRODUCTION OF ANODIZED MATERIAL

[75] Inventor: Harald Severus-Laubenfeld, Winterthur, Switzerland

[73] Assignee: Swiss Aluminium Ltd., Chippis, Switzerland

[21] Appl. No.: 926,280

[22] Filed: Jul. 20, 1978

Related U.S. Application Data

[60] Division of Ser. No. 764,001, Jan. 31, 1977, Pat. No. 4,158,079, which is a continuation of Ser. No. 489,417, Jul. 17, 1974, abandoned.

[30] Foreign Application Priority Data

Aug. 13, 1973 [DE] Fed. Rep. of Germany ....... 2340962

[51] Int. Cl.² .................... C25D 1/04; C25D 11/04
[52] U.S. Cl. .................................. 204/207; 204/206; 204/DIG. 7
[58] Field of Search .............. 204/206, 207, 228, 208, 204/213, DIG. 7

[56] References Cited

U.S. PATENT DOCUMENTS

| | | | |
|---|---|---|---|
| 1,574,823 | 3/1926 | Kronquest | 204/207 X |
| 3,522,166 | 7/1970 | Jones | 204/206 |
| 3,632,486 | 1/1972 | Herrmann | 204/207 X |
| 3,813,327 | 5/1974 | Crowne et al. | 204/206 X |

Primary Examiner—Arthur C. Prescott
Attorney, Agent, or Firm—Robert H. Bachman

[57] ABSTRACT

A composite material for graphical applications, in particular for nameplate production and having foil of aluminium or one of its alloys stuck on to a support foil. This aluminium foil bears on its side facing away from the supporting layer an aluminium oxide layer, which is thick by comparison with the thickness of the aluminium foil, on top of which there is a further layer of a light sensitive plastic.

12 Claims, 7 Drawing Figures

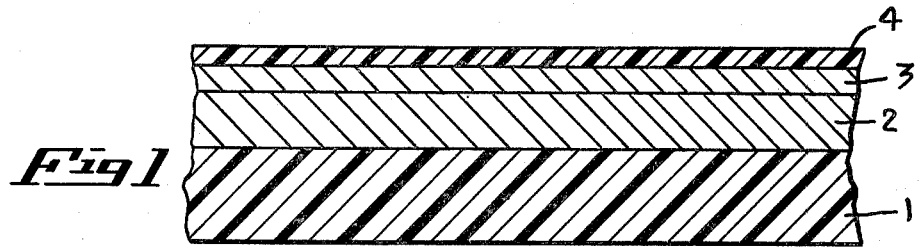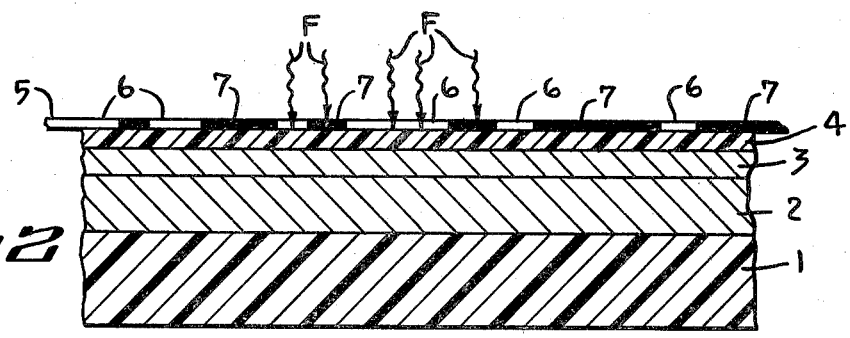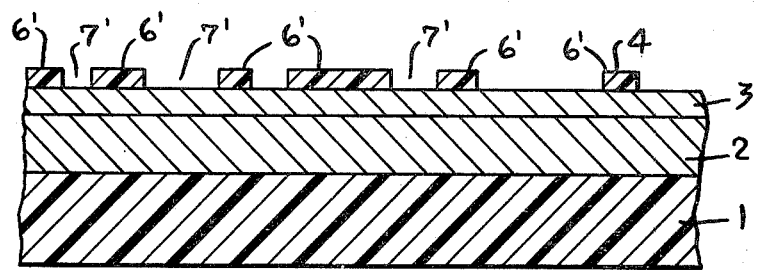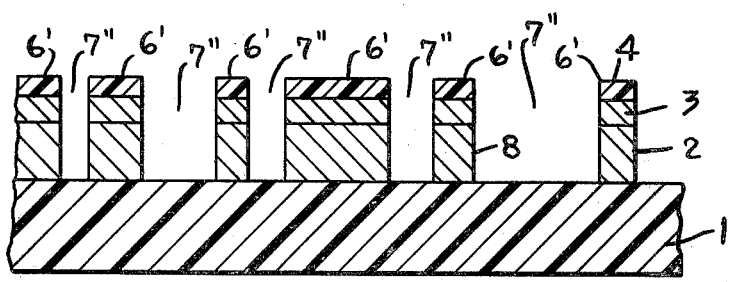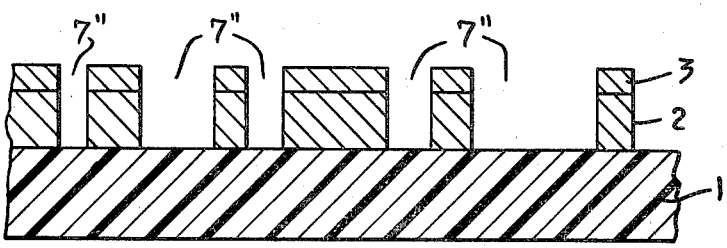

DEVICE FOR THE PRODUCTION OF ANODIZED MATERIAL

CROSS REFERENCE TO RELATED APPLICATIONS

This application is a division of copending application Ser. No. 764,001 U.S. Pat. No. 4,158,079, filed Jan. 31, 1977, which in turn is a continuation of application Ser. No. 489,417, filed July 17, 1974, now abandoned.

The invention concerns a composite material for graphic applications, in particular for the production of nameplates using a foil of aluminium or one of its alloys stuck on to a substrate, and a process for the manufacture of such a composite material and a device for carrying out the process.

For the manufacture of so called printed circuits it is known to cover a sheet of electrically conductive metal, e.g. copper which is stuck on to a support plate, with a light-sensitive platic, a so-called PR layer (Photo Resist layer), to expose a master pattern laid on top of this composite to UV-light, whereby the PR layer is hardened at those places where the master pattern is transparent, to dissolve away the unexposed parts of the PR layer and then to etch away the metal layer lying under these parts. This process has already found wide application in the electronics industry but in the graphics industry has up to now not been used, or has found no application worth mentionning.

A composite material consisting of an aluminium foil stuck on to a plastic support film has already been known for a long time for packaging or insulating purposes.

The object of the invention is to produce for graphical applications in particular for nameplate production, a particularly suitable composite material and a process and device for its manufacture.

To fulfil this objective a composite material of the kind described earlier is in terms of the invention characterized in that the aluminium foil bears, on its side facing away from the supporting layer, an aluminium oxide layer which is thick by comparison with the thickness of the aluminium foil and on top of this oxide layer a further layer of light-sensitive plastic (PR layer).

The thickness of the aluminium foil is advantageously 5 to 100 $\mu$m, preferably 20 to 50 $\mu$m and the thickness of the oxide layer at least 3 $\mu$m, usefully 4–14 $\mu$m. Such an aluminium oxide layer is relatively thick by comparison with the thickness of the aluminium foil but is however necessary to achieve the colour constancy of the normally coloured aluminium oxide layer.

A preferred thickness of the support layer, which is preferably made of plastic, is 100 to 200 $\mu$m, but plastic sheet of thickness greater than 1 mm can also be used.

With the described composite material patterns e.g. inscriptions can be made easily, in a similar way to that known in printed circuit technology. Thus a master pattern e.g. a film negative is laid on the composite material on the side covered with the light sensitive PR-layer. The composite is then "illuminated" i.e. exposed to UV light through the master pattern. As a result of the so-called negative-positive process those parts of the PR-layer which receive the UV light are hardened whilst those parts which are under the nontransparent parts of the master pattern remain unchanged. The subsequent developing then removes chemically the parts of the PR layer which were not exposed to the UV light, so that the aluminium oxide layer is laid bare at these places. The composite is then etched, removing aluminium oxide and aluminium up to the plastic support layer where the PR layer has already been removed. The support film then shows through these places.

With the so-called positive-negative process the developing stage removes the parts exposed to the UV-light. Finally, since the PR-layer is not weather resistant the PR layer is also removed from the exposed areas by so called stripping.

The described composite material can be used for graphical applications e.g. for putting patterns on interior surfaces and on facades, in particular to great advantage in the production of nameplates. Whilst nameplates have normally been produced individually by an engraving process and in series by printing, a plate can now be produced with very great time saving, in only a few minutes and by unskilled labour, such that the composite material, as described, is given a pattern and if desired mounted on to a stiffer substrate e.g. an aluminium plate. Every name plate user can produce his own plates, in particular individual plates or small series, without having to make a large investment.

Using the composite material in place of a homogenous material whith only one component e.g. an aluminium sheet, as has already been suggested for graphical purposes, has the following advantages: With the described treatment it is etched down to the plastic support film which is resistant to weathering and corrosion, and not to the blank aluminium which is susceptible to attack by corrosion. The composite material with the pattern is therefore more corrosion resistant. This corrosion resistance can be achieved, if aluminium is used, only by a subesquent treatment e.g. by anodising afterwards. The plastic support layer can be coloured in colours of one's choice, preferably in colours which contrast with the colouring of the aluminium oxide layer. With a simple aluminium base the pattern can only take on the colour of the bare aluminium on the etched places. The composite material makes possible therefore a large variety of colour combinations, which are given by the colour of the plastic support layer and the colouring of the aluminium oxide layer.

The plastic support layer can also be transparent. It can then be illuminated from behind and finds new applications for instrument panels in the construction of aircraft or motor car industry.

The substrate layer can also be phosphorescent i.e. self-illuminating in the dark.

Because of the flexibility of the plastic substrate the composite can be made suit the base it is mounted on e.g. fixed around a corner of a solid substrate.

The application of the composite material for the production of nameplates in the way described leads not only to a considerable saving of time but also to a substantial decrease in the cost of the nameplate.

The composite material in accordance with the invention can exhibit additional features which make it particularly suitable for graphical applications. Thus the supporting plastic can be mechanically roughened on the side facing the aluminium foil to produce a matt surface finish. This is completely nonstandard. If for example a plastic foil which serves as drawing paper may be provided with a matt surface finish, in that a layer with a naturally matt i.e. rough surface is deposited on it. It was however found that because of the chemical effect this layer comes off.

Furthermore, it is useful if the plastic support layer can absorb UV rays to prevent it from turning yellow. This is usually achieved by providing a special UV absorption layer. The applicant discovered however that such a layer would be destroyed chemically at the stripping stage. For this reason a further embodiment of the invention is that the support layer contains a UV absorbing substance in the form of a so-called additive which is already mixed into the plastic of the support layer before its production.

A further materials problem which had not appeared before was that the adhesive joining the plastic support layer to the aluminium foil must be removable because otherwise, after etching, the adhesive and not the plastic of the support layer would appear. Using a further useful development of the invention the adhesive is so made that it can be removed by means of an organic solvent, preferably one which also removes the PR layer. Finally the adhesive is made such that it can be removed without trace.

A process for the manufacture of the described composite material whereby a foil material is constructed by adhesively coating a support layer with a blank aluminium foil, is in accordance with the invention characterized by the following further stages of the process.

(a) Providing the foil material on the blank side of the aluminium foil with an aluminium oxide layer which is thick in terms of the small thickness of the foil.

(b) Colouring the aluminium oxide layer.

(c) Sealing the aluminium oxide layer.

(d) Coating the composite with a layer of light-sensitive plastic (PR layer).

Particularly in stage "a" problems which have never arisen before in the oxidation of aluminium have to be solved. These problems result mainly from the fact that a relatively thin foil has to be provided with an aluminium oxide layer which is thick in relation to the foil thickness. The aluminium oxide layer must therefore be relatively thick so that uniform and fast colours are achieved on colouring the oxide layer.

Usefully the aluminium oxide layer is produced by anodising the foil material in an electrolyte bath i.e. the aluminium foil which is already stuck on to the plastic support foil is anodised, whereby the foil material is preferably transported continuously as an endless coil through the electrolytic bath to achieve rapid and economic anodising.

The problems mentioned in association with this way of producing the oxide layer arise mainly because a very thin foil material has to be provided with an aluminium oxide layer which is relatively thick in terms of the thickness of the aluminium foil. It is the smallness of cross section transporting the anodising current to the strip of foil material which leads to the foil material being heated up. This heating up is all the more inconvenient since the plastic of the support layer, unlike the aluminium foil, exhibits a thermoplastic behaviour which can lead to stretching or creasing of the foil material.

As a remedy for this a further development of the invention provides for the foil material to be cooled in the air space between anode and entry into the bath and for the foil material to be led through the bath, past one, preferably several cathodes, whereby a stream of air has been found to be a favourable cooling medium. The mentioned air space is otherwise kept as short as possible.

A further problem in continuous anodising is that with increasing distance along the moving strip of foil material away from the point of entry into the bath the thicker is the aluminium oxide layer and thus the higher is the electrical resistance. In accordance with a further useful development of the process, in order to guarantee a uniform oxidation over the whole length of the bath, it is arranged that the effect of the cathodes on the foil material is increased with increasing distance from the point of entry into the bath. This can take place for example by the cathodes, spaced out next to and along the length of the strip to be anodised, being positioned increasingly closer to the strip and or being supplied with increasingly larger cathode voltage, with increasing distance from the point of entry into the bath.

The strip can be deflected several times in the electrolytic bath. A particular simple arrangement is found by passing the strip of foil material, which is to be anodised, horizontally in a straight line through the electrolytic bath. However at the exit end of the bath, with this arrangement an overflow must be provided.

The invention is explained in more detail with the aid of the following schematic drawings. These show:

FIG. 1 A section through a composite material in accordance with the invention.

FIGS. 2–5 Sectional views as in FIG. 1 showing the basic stages of production of a graphic pattern on a composite material as in FIG. 1.

FIG. 6 A sectional front view, schematically drawn, of a device for providing a strip shaped foil of aluminium, stuck on to a plastic support foil, with an aluminium oxide layer and shown here is an intermediate stage of the manufacture of the composite material of the invention.

Figure 7:
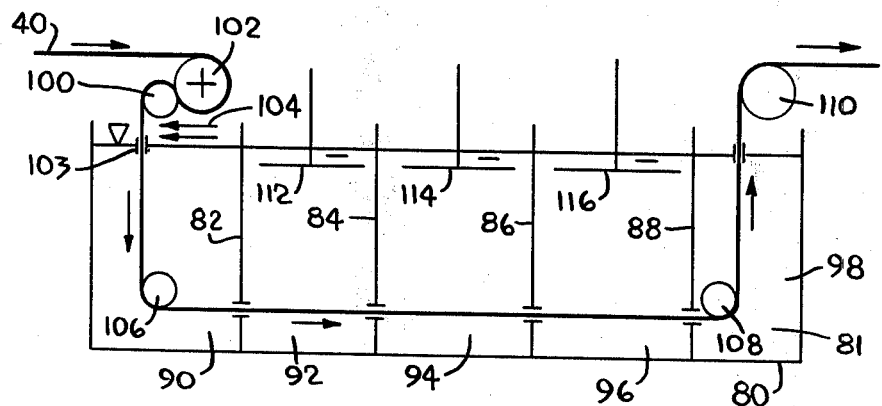

FIG. 7 The same kind of schematic drawing as in FIG. 6, this time showing another version of the device.

The composite material of FIG. 1 has four layers. The bottom layer is a supporting layer 1 of flexible plastic which is stable with respect to light rays, etch-proof and heat-proof. The stability with respect to light rays is achieved by the plastic having a known additive which absorbs UV light rays, mixed into it before being manufactured as a foil for the supporting layer 1. The plastic can be a polyester. The thickness of the support film can be 100 to 200 $\mu$m, by way of example 180 $\mu$m.

An aluminium foil 2 is stuck on to the support film 1 by means of an adhesive which is not shown here. The thickness of the aluminium foil is preferably 5–100 $\mu$m, by way of example 40 $\mu$m.

On the side of the aluminium foil facing away from the supporting layer 1 there is an aluminium oxide layer 3 which is at least 3 $\mu$m thick. In one example the aluminium oxide layer is 8 $\mu$m.

On top of the aluminium oxide layer 3 there is a layer 4 of light sensitive plastic, a so called PR layer (Photo Resist layer). The plastic of the layer has the property of hardening when exposed to UV light. Both the aluminium oxide layer 3 and the supporting layer 1 can be coloured, if desired in contrasting colours. The supporting foil 1 can also be transparent.

A description of how the composite material of the construction just described is provided with a visible pattern will now be given with the aid of FIGS. 2–5.

FIG. 2 shows the first stage of production of such a pattern. A master pattern e.g. a film negative 5 is laid next to the PR layer. The master pattern has light-transparent areas 6, and areas 7 shown as dark in the drawing and which are nontransparent. The master pattern is then illuminated with UV light in such a way that the UV light is travelling approximately parallel to the arrow P when it strikes the master pattern. The master pattern allows the UV light to pass through the transparent areas 6 where it strikes the PR layer beneath and causes the PR layer to be hardened there (Negative-positive process). The parts of the PR layer under the non transparent areas 7 remain unchanged. In the same way a Positive-positive process could be used whereby on developing, the exposed areas are removed.

The stage just described was mentioned in the introduction as the "illumination stage".

In the following two stages portrayed by FIGS. 3 and 4, the "developing" takes place.

In these, stages the areas of the PR layer lying under the non-transparent parts 7 of the master pattern as in FIG. 2 and which were not hardened, are removed using a solvent so that hollow spaces 7' are produced as shown in FIG. 3. Those parts of the PR layer which were at the light areas 6' remain unchanged. In this way a faintly visible relief pattern of the master pattern is produced on the composite.

In order to make this image visible, the material of layers 2 and 3 lying immediately below the places where the PR layer was removed, is etched away to expose the supporting foil 1, leaving deeper hollows 7". Even if the sides 8 of the hollows 7" are not as vertical to the supporting foil 1 as shown in FIGS. 4 and 5, on etching an accuracy of the same order of magnitude as picture points is achieved with the projections at the light areas. The copying of the pattern can in practice be of such a high quality that grey and intermediate tones can be reproduced.

In a final stage as shown in FIG. 5 and termed here as "stripping," the PR layer on the hardened areas are removed with an organic solvent to prevent the quality of the pattern produced from degenerating as a result of fading of the remaining part of the PR layer.

The reactions shown in FIGS. 2 to 5 can take place within a few minutes in a highly automated unit.

The finished article as in FIG. 5 bears a durable pattern on a flexible substrate and depending on the colouring of the aluminium oxide layer 3 and the colouring of the transparent or opaque supporting layer 1, offers graphic images of the most varied kind which can find applications of the widest possible variety.

The composite material in accordance with FIG. 1 is particularly suitable for fast and inexpensive production of nameplates, instruction panels etc. The plate bearing a pattern e.g. an inscription, produced as shown in FIGS. 2-5, can be mounted on a rigid supporting plate or can be affixed directly to the place of application. The latter method of use offers the advantage that because the composite is flexible it can be mounted around corners or edges.

Devices and a process of manufacturing the composite will now be described with the aid of FIGS. 6 and 7.

The device shown in FIG. 6 in cross section, has a container for an electrolyte 22 e.g. a dilute sulphuric acid. The electrolyte is subdivided by exchangeable separating walls 24, 26 and 28 into chambers 30, 32, 34 and 36.

A strip 40 of foil material is led upwards to an anode roll 42 denoted by a + sign, from a supply coil not shown in FIG. 6. The strip is a laminate produced by sticking a blank aluminium foil onto a plastic support foil. The thickness of the support foil is at least 10 $\mu$m e.g. 180 $\mu$m whilst the aluminium is 5–100 $\mu$m thick, e.g. 40 $\mu$m. The aluminium side of the strip 40 faces the anode roll so that the anodising current can be taken up by the strip from the roll.

The anodising roll 42 deflects the strip 40 through 90° so that the strip 40 passes horizontally through the electrolyte. The strip 40 is cooled between the entry slit and the anode roll 42 by a ventilator fan (not shown here), which blows a stream of air on to the aluminium side of the foil in the direction of the arrow 46. The air cooling has been found to be surprisingly useful. With it a deformation due to excessive heating can be avoided. This excessive heating arises because a large electrical current has to be passed through a very small cross section. Because the cross section of the aluminium is very small the electrical resistance is very high and leads to the heating effect just mentioned.

The amount of cooling required can be kept small by making the distance between the anode roll 42 and the inlet slit 44 to the bath as short as possible. Such a construction is preferred therefore. There is however a lower limit to the diameter which the anode roll 42 can have. Thus a construction, in which a special deflection roll of small diameter is used, is preferred. This deflection roll is advantageously water-cooled. The larger diameter, separate anode roll is placed as close as possible to the electrolyte. Such a construction is shown in FIG. 7 which is still to be described.

The heat developed between the point at which the strip leaves the anode roll and the point of entry into the electrolyte is directly proportional to the square of the electric current supplied, to the square of the length of strip in the air between roll and electrolyte and inversely proportional to the strip speed. It is therefore advantageous if the cooling capacity of the ventilator can be regulated. A projecting wall 48 is provided to prevent any mechanical damage to the strip 40 between the anode roll 42 and the entry slit 44, the said projecting wall 48 preventing the strip 40 from buckling under the pressure of the cold air stream.

Cathodes 50, 52, 54, 56 are provided in the tank sections 30 to 36. The cathodes can be tilted at various angles.

One of the main difficulties in continuous anodising is to distribute the current uniformly during the oxidation process in order to keep the properties and the growth of the oxide layer constant. The oxide layer can be regarded as an ohmic resistance. The voltage loss increases therefore along the whole length of the bath so that there is tendency for the greater part of the current to flow in the unoxidised or little oxidised part of the strip. This would lead to damaging or scortching of the foil.

This harmful tendency is opposed first of all by dividing the bath into sections 30 to 35, by the distribution and arrangement of the cathode, and by the separate power supply.

As shown in FIG. 6 the cathodes 50 and 56 are supplied from a common transformer 60 via individual rectifiers 62, 64, 66, 68 which are adjusted for each cathode. The leads from the rectifiers 62–68 are so connected to the trasformer windings that the cathode next to the entry slit 44 has the lowest voltage. This voltage is then increased with increasing distance of the cathode in question from the entry point 44 and the increase may for example be linear.

It can also be seen in FIG. 6 that the cathodes are placed closer to the strip the further the cathode is from the entry point 44. The strip is fed into the bath through the entry slit 44 and led out through the exit slit 70. Any electrolyte which spills out through these slits is collected in the overflow tanks 45 and 72 and if desired returned to the tank 22. The foil which has now been provided with an aluminium oxide layer is deflected over a roll 74 and led to a coiling roll which is not shown. This coiling roll and or the roll 74 can be power driven and function as the drive roll to pull the strip from the uncoiling roll which is not shown through the bath. A strip speed can be 1–2 m/min. with the device shown. A 50 cm wide strip of which 13.5 m is immersed in the electrolyte at any given time and using a current density of 139 A/mm$^2$ can be provided continuously with an aluminium oxide layer 8 $\mu$m thick with a throughput of 480 m$^2$/8h.

The device as in FIG. 7 has a container 80 which is divided into sections 90, 92, 94, 96 and 98 by the dividing walls 82 84, 86 and 88. In contrast to the device shown in FIG. 6 the strip 40 is led over a small water-cooled deflection roll 100. There is also provided, separate from this, an anode roll 102 which contacts the strip on its aluminium side at about the height of the deflection roll. With this arrangement the distance the strip covers in the air between the point it loses contact with the anode roll 102 and the point of entry 103 into the elctrolyte 81 is kept very short. Also, in the case of the device in accordance with FIG. 7 there is provided however a means of cooling with ventilators for this distance traversed in the air, and the amount of cooling can be changed to suit the needs of various strip speeds. The ventilators blow onto the strip in the direction of the arrow 104.

The strip is deflected into a horizontal plane in the first section by means of a further deflection roll 106 and led through the dividing walls, through the individual sections of the bath to another deflection roll 108 in the last section 98 where the strip is led vertically upwards again and out to a power driven roll which pulls the strip through the tank.

In the example shown in FIG. 7 a cathode 112, 114 and 116 is arranged in each of the sections 92 to 96 all at the same distance from the strip and facing its aluminium side. In contrast to the device shown in FIG. 6, however, the cathode 112 is separated from the entry point 103 by a dividing wall 82. This dividing wall is provided however with the device in accordance with FIG. 7 to avoid a short circuit between the entry point 103 of the strip and the cathode 112. A short circuit could otherwise occur because the resistance to the passage of the electric current is smaller there than through the bath and the strip which has an increasingly thicker oxide layer the further from the entry point 103 and therefore has a larger electrical resistance.

The power supply to the cathodes 112, 114, 116 is not shown in FIG. 7. It can take place in the same way as in the device shown in FIG. 6 where the transformer winding 60 is connected to the anode supply via a supply line 61 which ends in an arrow in FIG. 6.

The described anodic oxidation of the foil, in practice, takes place only after some preparatory treatment of the foil. The foil is firstly degreased and then with intermediate rinsing, is etched, neutralised and dried. These treatments can for the greater part take place by immersion and/or spraying and usefully are done continuously and at the same rate as the anodic oxidation. After the anodic oxidation and a subsequent rinsing the strip can be treated with a nitric acid solution, rinsed again and then coloured in a continuous process whereby the quality of the colour is dependent on the thickness of the aluminium oxide layer produced by the anodic oxidation. The minimum thickness of oxide layer is about 3 $\mu$m. The colouring takes place conventionally by immersing in a bath whereby the indigenous pores in the aluminium oxide layer are filled with colouring material. Following on from the colouring stage the strip is rinsed once more and then subjected to a sealing operation. In the sealing operation the pores filled with colouring material are closed by making the oxide layer swell in almost boiling water. In this stage care must be taken that the support foil does not become wavy on immersing in hot water or steam. For this reason the sealing temperature is lower than in the normal sealing operation and in one device used was 80° C.

The result is a foil material with a coloured and sealed aluminium oxide. In the final manufacturing stage of the composite material the aluminium oxide layer is coated with a PR layer.

What we claim is:

1. A device for the production of anodized aluminum or aluminum alloy foil which comprises: a strip of said foil; an electrolyte bath and an entry point to said bath; an anode roll spaced from said entry point and bath over which the foil passes on its way to said entry point and bath; cooling means for cooling the foil between said anode roll and point of entry; and at least one cathode in said electrolyte bath through which the foil passes, whereby deformation due to excessive heating is avoided.

2. A device according to claim 1 wherein the strip of foil is a continuous strip.

3. A device according to claim 1 including a plurality of cathodes provided that the effect of said cathodes on said foil is increased with increasing distance of the foil in the electrolyte from said point of entry.

4. A device according to claim 1 wherein said foil is a composite material including a first layer of flexible plastic material and a second layer of aluminum or aluminum alloy adhesively bonded thereto, wherein the aluminum side of said composite faces the anode roll.

5. A device according to claim 1 including a plurality of cathodes wherein said cathodes are supplied with increasingly greater voltage the further they are from said point of entry.

6. A device according to claim 1 wherein a separating wall is provided between said point of entry and cathode.

7. A device according to claim 1 including a plurality of cathodes arranged closer to the foil the further they are from said point of entry.

8. A device according to claim 1 including a plurality of cathodes arranged so that the distance therebetween can be varied.

9. A device according to claim 1 including a plurality of cathodes arranged so that the distance between said cathodes and foil can be varied.

10. A device according to claim 1 including a plurality of cathodes arranged so that the angle thereof can be varied.

11. A device according to claim 4 wherein said plastic material has a thickness of at least 10 $\mu$m and wherein said aluminum has a thickness of from 5 to 100 $\mu$m.

12. A device according to claim 3 wherein said bath is divided into a plurality of sections and wherein one of said cathodes is located in each section.

* * * * *